US006169638B1

(12) United States Patent
Morling

(10) Patent No.: US 6,169,638 B1
(45) Date of Patent: Jan. 2, 2001

(54) AUTOMATIC GAIN CONTROL CIRCUIT AND METHOD

(76) Inventor: Robert Philip Morling, 9 Rockside Drive, Henleaze, Bristol BS9 49W (GB)

(*) Notice: Under 35 U.S.C. 154(b), the term of this patent shall be extended for 0 days.

(21) Appl. No.: 08/934,762

(22) Filed: Sep. 22, 1997

(30) Foreign Application Priority Data

Sep. 24, 1996 (EP) .................................................. 96306941

(51) Int. Cl.[7] .................................................. G11B 5/09
(52) U.S. Cl. ............................. 360/46; 360/67; 360/65; 330/254
(58) Field of Search .................. 360/46, 67, 48, 360/51, 65; 330/254, 278

(56) References Cited

U.S. PATENT DOCUMENTS

| 3,660,821 | 5/1972 | Weber et al. . |
| 3,879,674 | 4/1975 | Dragon . |
| 4,870,370 | 9/1989 | Hedberg et al. . |
| 5,081,653 | 1/1992 | Saito . |
| 5,319,508 | * 6/1994 | Tsunoda et al. ........................ 360/67 |
| 5,463,603 | * 10/1995 | Peterson .................................. 360/67 |
| 5,467,231 | 11/1995 | Nash et al. . |

FOREIGN PATENT DOCUMENTS

| 0063935 | 11/1982 | (EP) . |
| 0192061 | 8/1986 | (EP) . |
| 6-244660 | 9/1994 | (JP) . |
| 89/02190 | 3/1989 | (WO) . |

* cited by examiner

Primary Examiner—Alan T. Faber

(57) ABSTRACT

An automatic gain control 20 is adapted to compensate to equalise the gain for signals of different characteristics (e.g. the preamble region and the main data region of a signal retrieved from a tape). The signals are amplified by a VGA 32, the output of which is monitored by a peak detector 44, whose output is compared at amplifier 48 with a respective target value for the particular signal region from a associated counter or register 60, 62, 65, to control the gain control signal applied to the VGA 32 by a gain control 50. The output of the comparator amplifier 48 is monitored before and after the transition between the first and second signal regions and the reference values in the appropriate register 60, 62 incremented or decremented in accordance with any step in the output of the amplifier 48, substantially to equalise the gain before and after the transition.

32 Claims, 4 Drawing Sheets

AUTOMATIC GAIN CONTROL CIRCUIT AND METHOD

TECHNICAL FIELD

This invention relates to data processing apparatus and methods, and to electronic circuits for use in connection therewith. In particular, but not exclusively, the invention relates to apparatus and methods for retrieving data stored using a DDS Data Storage System. The invention also extends in general to apparatus and methods for processing data in one or more communications channels.

BACKGROUND ART

It is already known to provide reliable storage and retrieval of large volumes of digital data, such as computer data, in particular by means of the DDS (Digital Data Storage) format defined in ISO/IEC standard 12247.

In a DDS read/write mechanism using the above format, data are recorded on an elongate recording media, comprising a tape coated with a magnetic medium, by a rotating drum carrying one or more electromagnetic heads. The tape is moved by a motor-driven capstan along a path extending between two spools or reels and wrapped partially around the drum. The plane of rotation of the heads of the drum is disposed at an angle to the plane of movement of the tape, so that each head traverses the tape along successive tracks extending across the width of the tape at an angle to its centre line. The mechanism includes appropriate circuitry for encoding data into signals suitable for recording onto tape, including error-detection and correction codes, and for conditioning of those signals into a form which is optimally matched to the characteristics of the recording media. For data retrieval, additional circuitry is provided for detecting magnetic field variations stored on the tape, deriving corresponding signals, conditioning those signals into a form suitable for subsequent processing, decoding the encoded data and detecting and correcting errors.

In a current format (DDS-2), data are recorded at a bit density of approximately 61 kilobits per inch (kbpi) (equivalent to approximately 24 kilobits per centimetre) At this bit density, a typical DDS tape cartridge can currently store up to approximately 8 gigabytes of data, using the longest practicable tape and techniques such as data compression to maximise the quantity of data the tape can accommodate. With the steadily increasing use of computer equipment and the volumes of data processed and stored by such equipment, it has become desirable to increase the capacity of a DDS tape cartridge still further.

We are in the process of developing a new format (DDS-3) which further increases the storage capacity by doubling the linear recording density and increasing the proportion of a recorded track that is available for user data. Together, these improvements are estimated to provide about three times the data capacity of DDS-2, for a cartridge of given tape length. The DDS-3 format, when recorded on the longest practicable tape, is designed to provide a storage capacity of 12 gigabytes of uncompressed user data or typically 24 gigabytes of compressed user data.

Reference is directed to our earlier published International Patent Application WO95/15551 for further details of this scheme, the contents of the earlier Patent Application being incorporated herein by reference.

Because the linear bit density in DDS-3 is twice that of DDS-2, the bit spacing on the tape is approximately one half of the gap of the preferred read head. This means that the output signal from the read head, instead of varying between two discrete levels (+1,−1) will vary between three (+2,0,−2), and as such, DDS-3 will be a 3-level system.

It is proposed to recover recorded data by means of a partial-response maximum-likelihood (PRML) data recovery channel.

"Partial Response" denotes a practicable Partial Response signalling scheme which only requires up to the Nyquist frequency bandwidth for data transmission, by enforcing deterministic intersymbol-interference at the detector input. An example is the PR-1 (or duobinary) Partial Response system (recording channel transfer function) which is described by the discrete time transfer function $F(D)=D+1$. Other examples such as class IV or PR-4 exist, and we do not exclude these possibilities.

"Maximum Likelihood" denotes a Maximum Likelihood Detection decoding scheme, implementing a Viterbi algorithm, which chooses the most likely sequence of output data, using a sequence of received samples, instead of just one received sample at a time.

In the read-mode of a typical proposed scheme for DDS-3, the approximately equalised signal is taken and is subjected to Automatic Gain Control to establish and stabilise the signal amplitudes, and then to full Adaptive Equalisation to a combined PR-1 target. In the Adaptive Equalisation step, an adaptive, sampled finite impulse response filter is used to provide a three-level PR-1 target transfer function. In one embodiment, after Adaptive Equalisation, the signal undergoes analogue to digital conversion, followed by three-level Viterbi (or Maximum Likelihood) detection. In order to do this, clock information is extracted from the input signal and used to synchronise the Adaptive Equaliser, the analogue to digital converter, and the Viterbi decoder. In another embodiment, the Adaptive Equalisation may instead be performed after analogue to digital conversion.

As in previous DDS formats, in the proposed DDS-3 format, data is stored as a series of tracks of alternate azimuth (referred to as the A track and B track respectively). Each end of each track is occupied by a margin region which is expendable, the front margin being followed by a preamble region, which is often indistinguishable from the margin. The preamble region is normally a plain sinusoidal tone and does not carry any data, but exists to enable the AGC loop and the clock recovery loop to achieve fast lock-on and also to identify the start of the main data region. A preamble detector controls the Adaptive Equaliser to ensure that the channels do not try to adapt the preamble or margin regions, because otherwise they will not be optimised for the data portion.

In this Specification, the term communications channel is used broadly to include channels of data retrieved from a recorded medium.

SUMMARY OF THE INVENTION

For stable operation of the Viterbi detector and the Adaptive Equaliser, the gain in the signal should not vary outside preset limits. Ideally, the absolute gain and the relative gain in the signal is less than 1% for the Viterbi detector, although it is tolerant of slightly greater variation in absolute gain. The Adaptive Equaliser is not so demanding but still typically requires the offset gain to be less than 10% and the relative gain to be less than 1%.

We have found that a conventional automatic gain control loop using peak detection may introduce a gain step at the interface between the preamble and main data regions due to their varying spectral characteristics, and this could be interpreted incorrectly downstream as a change in signal level.

Certain gain control systems exist which use a peak detector to make a coarse adjustment of the gain and then examine individual bits to effect fine adjustment. These types of system are data driven and prone to collapse if the clock recovery is disturbed.

We have developed a gain control system which is more robust as it does not require recovery of the clock signal. Furthermore, in a preferred system, a common simple peak detector may be used, even though the margin/preamble and main data regions have different spectral characteristics.

Accordingly, in one aspect of this invention, there is provided an automatic gain control circuit for automatic gain control of an input signal comprising a first signal region followed by a second signal region, which circuit comprises:

variable gain amplifier means for receiving and amplifying said input signal;

a gain control loop responsive to the output of said amplifier means and to respective target values for said first and second signal regions to control the gain applied by said amplifier means, target control means for monitoring the gain applied for each of said first and second signal regions and for adjusting at least one of said target values in accordance therewith.

In this way it is possible automatically to calibrate out a differing response of the gain control loop to spectral differences of the first and second signal regions. It will be appreciated that embodiments of the automatic gain control circuit may be extended for use with signals comprising more than just two regions, to calibrate out gain steps at each transition between signal regions.

Preferably, one of said target values remains constant and the other thereof is adjusted in accordance with said monitored gain signal.

The automatic gain control circuit of this invention may be adapted to operate with two different input signals, e.g. from an A track and from a B track. Thus the circuit may include means for receiving a further input signal (for example the B track) also comprising a first region and a second region, and said gain control loop may also be responsive to a respective target value for at least one of said first and second signal regions of said further input signal.

The response of said gain control loop is preferably relatively fast compared to that of said target control means.

To allow the automatic gain control circuit to adapt swiftly yet smoothly, the circuit preferably includes means for adjusting the response or bandwidth of the gain control loop between preset values. For example, the bandwidth may be high at the start of the first signal region to achieve fast lock on, followed by medium bandwidth to allow accurate settling and then low bandwidth shortly before the second signal region.

Where the automatic gain control circuit is used in a data retrieval apparatus for controlling the signal comprising tracks or blocks of data, e.g. in a tape storage device, said first signal region may comprise a preamble or margin region, and said second region may comprise a random data region. The transitions between the preamble/margin region and the random data region may conveniently be detected using a preamble detector.

The gain control loop advantageously comprises a common peak detector means for detecting peaks in both the first and second signal regions of the output from said amplifier means, although other level monitoring systems may be used.

In another aspect, this invention provides an automatic gain control circuit for automatic gain control of an input signal which includes a first and a second signal region, said circuit comprising:

gain control loop comprising variable gain amplifier means, gain control means for adjusting the gain applied by said variable gain amplifier means in accordance with the output of said amplifier means and respective target reference values for said first signal region and said second signal region, thereby to reduce or minimize the difference in the gain applied to said first and second signal regions.

The invention also extends to an automatic gain control method for providing substantially continuous gain of a signal comprising a first signal region followed by a second signal region of different characteristics, which method comprises monitoring the gain control signal in a gain control loop, providing respective target values for said first and second signal regions, determining values of said gain control signal in said first signal region and said second signal region, and adjusting at least one of the target values in accordance with said values.

Whilst the invention has been described above, it extends to any of the features set out above or in the following description.

BRIEF DESCRIPTION OF THE DRAWINGS

The invention may be performed in various ways and, by way of example only, an embodiment of the invention will now be described in detail, reference being made to the accompanying drawings in which.

DESCRIPTION OF THE PREFERRED EMBODIMENT

The data storage apparatus now to be described utilises a helical-scan technique for storing data in oblique tracks on a recording tape in a format similar to that used for the storage of PCM audio data according to the DATC Conference Standard (June 1987, Electronic Industries Association of Japan, Tokyo, Japan). The present apparatus is, however, adapted for storing computer data rather than digitised audio information. In conventional manner the apparatus includes a helical-scan tape deck in which magnetic tape passes at a pre-determined angle across a rotary head drum whilst the head drum is rotated. The head drum houses a pair of diametrically opposed read heads and a pair of diametrically opposed write heads at 90° to the read heads. In known manner, these heads in use write overlapping oblique tracks across the tape, with the tracks written by one head having a positive azimuth and those written by the other head having a negative azimuth.

The tracks are used to store data provided to the apparatus (main data) together with items of auxiliary information known as sub-codes which relate, for example, to the logical organisation of the main data, its mapping onto the tape, certain recording parameters (such as format identity, tape parameters etc.,) and tape usage history. The tracks also contain synchronisation bytes ("sync bytes") to enable data byte boundaries to be identified, and which are used to generate timing signals for controlling tape movement etc. At the beginning and end of each track are margin regions and there is a preamble block between the beginning margin and the main data area.

Figure 1:
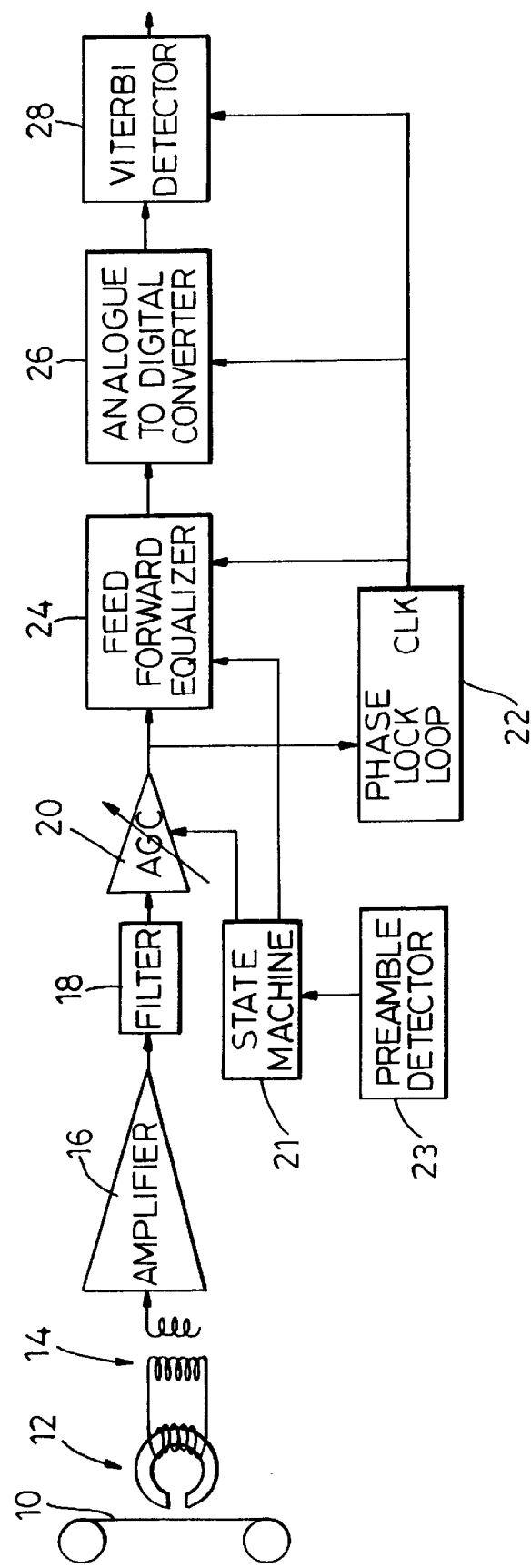
FIG. 1 is a schematic block diagram of the main components of an embodiment of a data retrieval apparatus incorporating apparatus in accordance with this invention.

Referring now to FIG. 1, data stored on tape 10 is read by a read-head 12 on the main drum and the signal passes via a rotary transformer 14 to an amplifier 16 and thence to a filter 18 for initial approximate equalisation to a combined PR-1 target. In practice a differential signal is taken from the read head, rather than making one end grounded. FIG. 1, however, shows just one signal line. The signal is then supplied to an automatic gain control (AGC) circuit 20 for establishing and stabilising the +2 and −2 amplitudes of the three-level signal received from the filter and integrator 18. The signal from the AGC circuit 20 is supplied to a phase lock loop (PLL) 22 for recovery of a clock signal and is also passed to an adaptive filter referred to herein as a feed forward equaliser (FFE) 24 which provides adaptive equalisation to a combined PR-1 target, so that the overall channel frequency response matches the characteristic of an ideal PR-1 partial response channel. The filtered signal is supplied to an analogue to digital converter (ADC) 26 which produces a digitised version of the filtered signal, for supply to a Viterbi detector 28. The output of the Viterbi detector 28 is an NRZI-encoded data stream. In other embodiments, the feed forward equaliser 24 may be located after the analogue to digital converter instead of before it.

Figure 2:
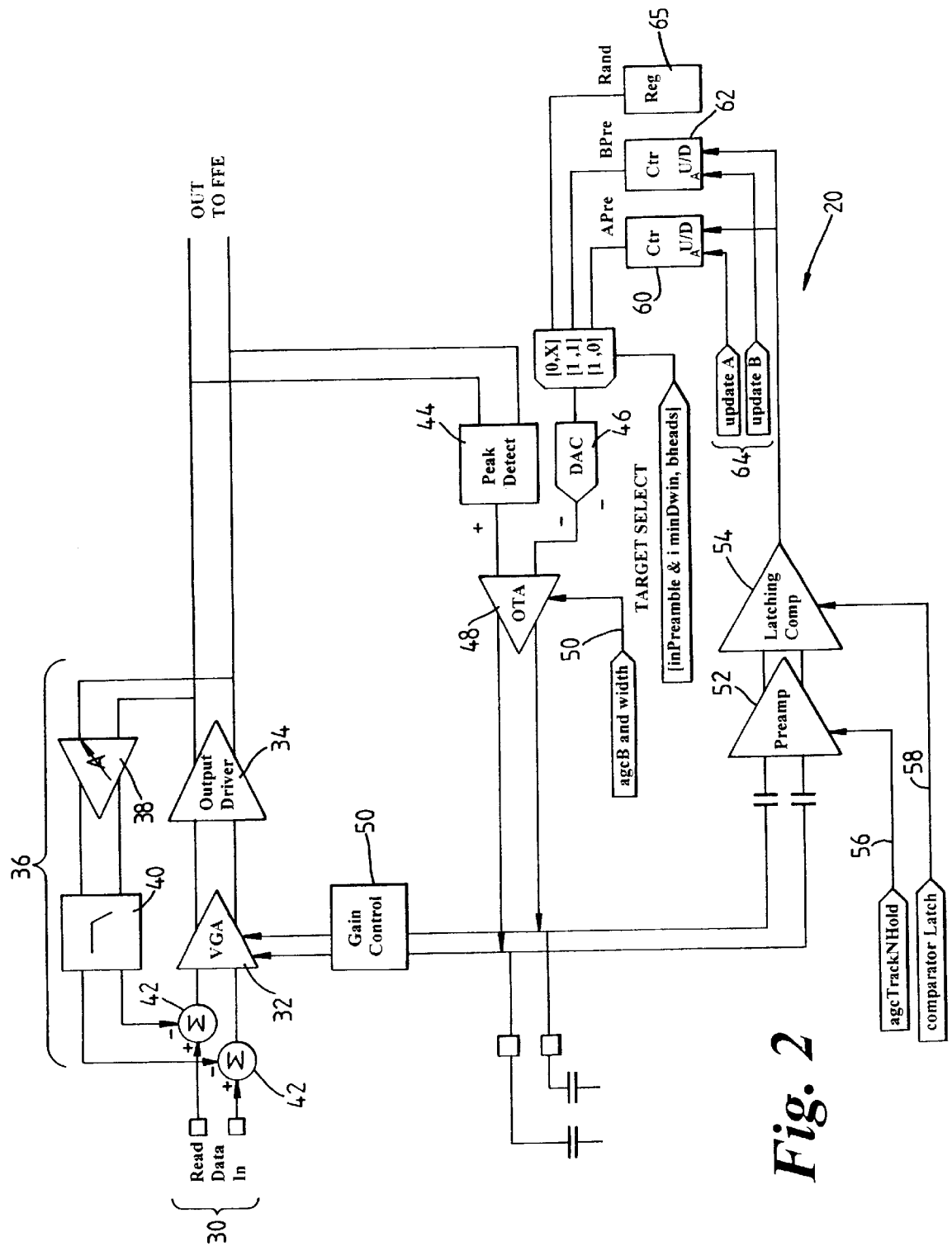
FIG. 2 is a block diagram of an embodiment in accordance with this invention, of an automatic gain control system forming part of the apparatus of FIG. 1.

Referring now to FIG. 2, an embodiment of automatic gain control system in accordance with this invention is shown here in more detail and the two differential signal lines are evident.

In operation, the automatic gain control system serves to present a constant signal amplitude to the FFE 24 to within a specified nominal amplitude. For ideal operation, this amplitude must not vary along the length of any one track, or between tracks of the same azimuth. Within the bounds of a specified absolute gain error, it does not matter what the signal amplitude is, as long as it remains substantially constant. The variation of the amplitude of the VGA 32 during any transient behaviour of the AGC control loop must be controlled to within a pre-set relative gain error, which is much smaller than the absolute gain error. The recorded track comprises zones of differing spectral characteristics. The most important of these zones are the preamble regions and the random data regions. For ideal operation downstream of the AGC block 20, the AGC system, when taken as a whole, must be immune to changes in frequency spectrum. The relative amplitude tolerance must not be exceeded on either side of the boundary between preamble regions and random data regions.

The signal is input on lines 30 to the voltage gain amplifier (VGA) 32 and the output passes via an output driver 34 to pass onwards to the ADC 26 or FFE 28 (not shown in FIG. 2). A feedback loop 36, comprising an amplifier 38, a low pass filter 40 and summers 42 is provided for DC offset control. The output from the output driver 34 also passes to a common, simple peak detector 44 which detects peaks in the output signal. The output of the peak detector 44 is supplied together with a target value from a digital to analogue converter (DAC) 46 to an operational transconductance amplifier (OTA) 48 (the VGA control voltage) acts as a comparator.

The output of the amplifier 48 (the VGA control voltage) is supplied to a gain control 50 which supplies the gain control signal to the VGA 32. The gain control loop defined by the peak detect circuit 44, amplifier 48 and gain control 50 has a relatively fast response time.

The output of the amplifier 48 is also supplied to a pre-amplifier 52 and latching comparator 54, which tracks a measure $VGA_1$ of the VGA control voltage at or immediately before the interface between the preamble region and the main data region, and then holds it. A second measure $VGA_2$ of the VGA control voltage is taken a number of channel bits later (i.e. at the beginning of the main data region). A direct comparison of $VGA_1$ and $VGA_2$ reveals whether the gain of the voltage gain amplifier 32 has increased or decreased in making the transition between the preamble region and the random data region. Based on this information, an appropriate counter 60;62 holding the preamble target for the peak detector of the appropriate A or B track is incremented or decremented. Adjustment of the preamble target is enabled and disabled via line 64. A register 65 holds a constant value for the random data target for the peak detector 44 under all conditions. The response of the target control loop is slower than that of the gain control loop.

After an initial training period, the preamble target will have adapted to equalise the VGA control voltages immediately prior to and after the interface between the preamble region and the main data region, separately for the A and B tracks with respective target values held in counters 60 and 62, ready for the next track.

Thus, in this circuit, the differing response of a simple peak detector 44 to preamble and random data is adaptively calibrated out. The preamble target counters 60 and 62 are saturating counters which will not overflow or underflow, and so, if one currently holds its maximum count and is asked to increment, it will maintain its maximum count. Similarly, if it holds its minimum count and is asked to decrement, it will maintain the minimum count.

The bandwidth, i.e. response time, of the target control loop is adjusted between preset values by adjusting the bandwidth mode of the OTA amplifier 48 on line 51. The preamble regions of the A and B tracks exist to enable the clock recovery loop and AGC loop to achieve fast lock-up on data of known properties, and as such the regions are short. The bandwidth of the AGC system is selected to be high at the start of the preamble region to facilitate this fast lock-up. Once coarse amplitude settling has been achieved, medium bandwidth mode may be selected on line 51 until accurate gain amplitude settling has been achieved. Then low bandwidth mode is selected prior to the arrival of the random data so that excessive signal modulation by the VGA control voltage is avoided.

By this arrangement the gain can be controlled sufficiently accurately for the processing downstream.

Figure 3:
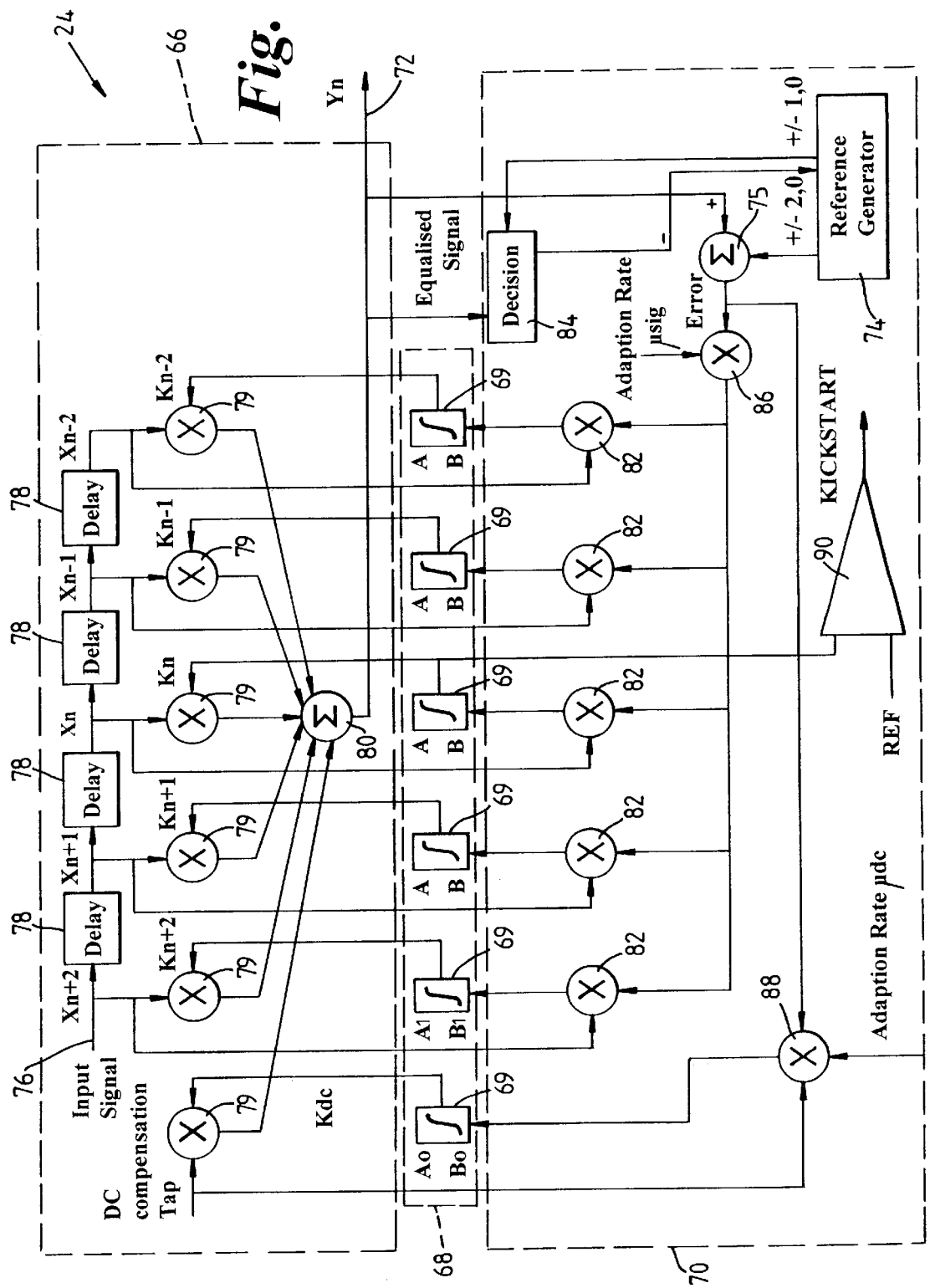
FIG. 3 is a block diagram of a feed forward equaliser (FFE) for use in the apparatus of FIG. 1.

Referring now to FIG. 3, after passing through the AGC block 20, the signal is applied to an FFE 24. The FFE 24 comprises a Finite Impulse Response (FIR) filter 66, a bank 68 of coefficient capacitors 69, and a circuit 70 for adapting the coefficients to reduce the error between the output on line 72 and reference values generated by reference generator 74.

The signal from the AGC block 20 is input into the FIR Filter 66 on a tapped delay line 76 with delays 78 which produce in parallel successively delayed versions of the input. The majority of the circuit elements within the FFE 24 may be implemented in switched capacitor technology. The input at 76 of the FIR filter 66 is sampled by charging a capacitor at the clock time determined by the phase lock loop (PLL) 22. This charge is then passed from one capacitor to another at the bit times to form a delay line. The output at each stage along the delay line is multiplied at a multiplier 79 by a respective weighting coefficient from the associated coefficient capacitor 69, and all the weighted outputs are summed by summer 80 to provide the filter digital output on line 72.

The coefficients in register 68 are repeatedly adapted to maximise the signal to noise ratio (SNR) in the equalised analogue signal on line 72, at the bit sampling times as defined by the phase lock loop 22, while the frequency response of the head and tape, or the head-tape contact conditions vary (either in manufacture or during operation).

In DDS-3 mode the PR-1 input signal will usually be approximately spectrally shaped by the filter 18, and will consist of three levels (+2,0,−2). In this case, in the adaption block 70, the coefficients are adapted in a least mean squares (LMS) algorithm, using an error signal which is the difference between the FIR filter output, and the nearest three level nominal signal level, provided by reference generator 74. The error signal is supplied in parallel to respective multipliers 82 together with the tapped and delayed input signal and this is used to adapt each of the coefficients in the coefficient capacitors 69.

In DDS-3 mode the equalised signal is monitored at 84 to determine whether it is considered to be a +2,0, or −2 signal using a reference from reference generator 74. The reference generator 74 supplies a slicing level signal of ±1 which the decision block 84 uses to decide whether the signal is meant to be +2, 0, or −2. The decision block then causes the reference generator 74 to supply the appropriate +2,0, −2 nominal level to the error summer 75 which also receives the filter output signal to obtain an error signal supplied to the multipliers 82. The rate of adaption may be altered between preset values (typically 6) for the signal ($\mu$sig) and DC coefficient ($\mu$dc), at multipliers 86 and 88.

The FFE 24 must not be allowed to adapt in the preamble or margin regions of the A and B data tracks as it would quickly maladapt away from the optimum coefficient set for the random data region. The beginning and end of the main data region are normally predicted by a data recovery state machine, which uses a combination of timing and intelligent decisions based on the structure of the data on the tape and the knowledge of the format being read, relying inter-alia on the preamble detector 23 (FIG. 1). The preamble detector 23 may be of conventional type, typically in the form of a matched filter matched to the pure sinusoidal tone in the preamble region, and supplying a high output when the signal contains the characteristic sinusoidal tone. The output of the preamble detector 23 is supplied to the state machine 21, which controls the target switching for the A and B preamble and main data targets in the AGC 20, and also selection of the A and B track coefficients in the feed forward equaliser 24, as to be described below.

The spectral characteristics of the A and B tracks differ, and the capacitors 69 store separate coefficients for the A and B tracks, with an appropriate set of coefficients being written to the FFE capacitors 69 at the beginning of each track.

The apparatus includes a set of coefficient registers (not shown) corresponding to the coefficient capacitors 69. The values held on the capacitors 69 can be processed by an A-D convertor and stored in the coefficient registers. For restoring the coefficients at the start of each track they are processed by a digital time log convertor and then supplied to the capacitors. Thus a typical sequence is as follows:

1. The contents of the A coefficient registers are written to the FFE coefficient capacitors 69.
2. The FFE adapts these coefficients over the A track, according to the adaption process implemented by block 70.
3. The adapted FFE coefficient capacitor 69 values are digitised and stored in the A coefficient registers, and the contents of the B coefficient registers are written to the FFE coefficient capacitors 69.
4. The FFE adapts these coefficients over the B track according, to the adaption process implemented by block 70.
5. The adapted FFE coefficient capacitor 69 values for the B track are digitised and stored in the B coefficient registers.

It should however be noted that various other routines may be followed. For example, each track may have its own standard set of coefficients which is loaded into the coefficient capacitors at the beginning of the track, irrespective of the adapted coefficient values at the end of the previous track of that azimuth. Alternatively, the coefficient capacitors may be loaded with adapted values taken part way through the previous track of that azimuth. The position at which the coefficients are taken may be optimised according to machine requirements to provide the best adaption. For example if the track is curved it may be best to take coefficients from approximately half-way along the track. For any design of machine, the optimal position may be determined empirically and then production machines programmed to take the coefficients at this point. It would be possible to take the A and B coefficients at different points.

Thus the adapted filter coefficients from the minimum error portions of the read operations for the previous A track may be used as the initial set of coefficients for the next A track and the same process applied to the B track coefficients. To avoid straying into end of track nonlinearities, a "snapshot timer" arrangement may be used to pick the coefficient values a predetermined time after the start of the minimum error portion of a read operation.

In one embodiment successive sets of coefficients for a given A or B track may be averaged over many tracks and used as the initial set of coefficients for the next A or B track respectively. This has the advantage that it is possible then to adapt quickly within a track, but slowly over multiple tracks. This may be implemented most easily in a digital scheme.

In a particular embodiment, in each of the A and B track coefficient sets, there are 13 signal coefficients and one DC coefficient.

If the FFE 24 is adapting while it counters a drop out in the read signal, then the FFE coefficients can maladapt into a state from which they cannot recover. To counter this, an automatic restart mechanism is built in. When the centre coefficient falls below a programmable threshold (e.g. 50%), the coefficients are all forced to a default set of values, for example a unit step impulse response in which the centre signal coefficient is loaded with the value 1 unit and the remaining signal coefficients are forced to zero. From this starting point, the FFE 24 is allowed to continue adapting. It either maladapts again, and the process is then repeated automatically, or it converges to the correct target if the drop out contains recoverable signal.

Thus, in the illustrated embodiment, the centre coefficient is supplied to a comparator 90 which compares it with a value of a preset reference from reference generator 91, and implements a "kick start" routine to force the default set of coefficients if the centre coefficient has fallen below a value which, in practice, is likely to lead to the coefficients stabilising to an incorrect state.

In track-crossing modes, where the track on the tape is misaligned with the scan path of the read head, the head output signal cycles between good and bad SNR many times per scan and in this situation the arrangement of FIG. 3 can increase the amount of data recovered.

It should be noted that a large number of stable, adapted states of the FFE coefficients are possible, but only a small set of these are useful in this scheme. The technique described above tests only the centre coefficient and so cannot detect all possible undesirable states. It will be appreciated however that the technique may be extended to monitor other coefficients in addition to or instead of the centre one and also a different default set of coefficients may be forced. Also ranges rather than single limits may be monitored.

Figure 4:
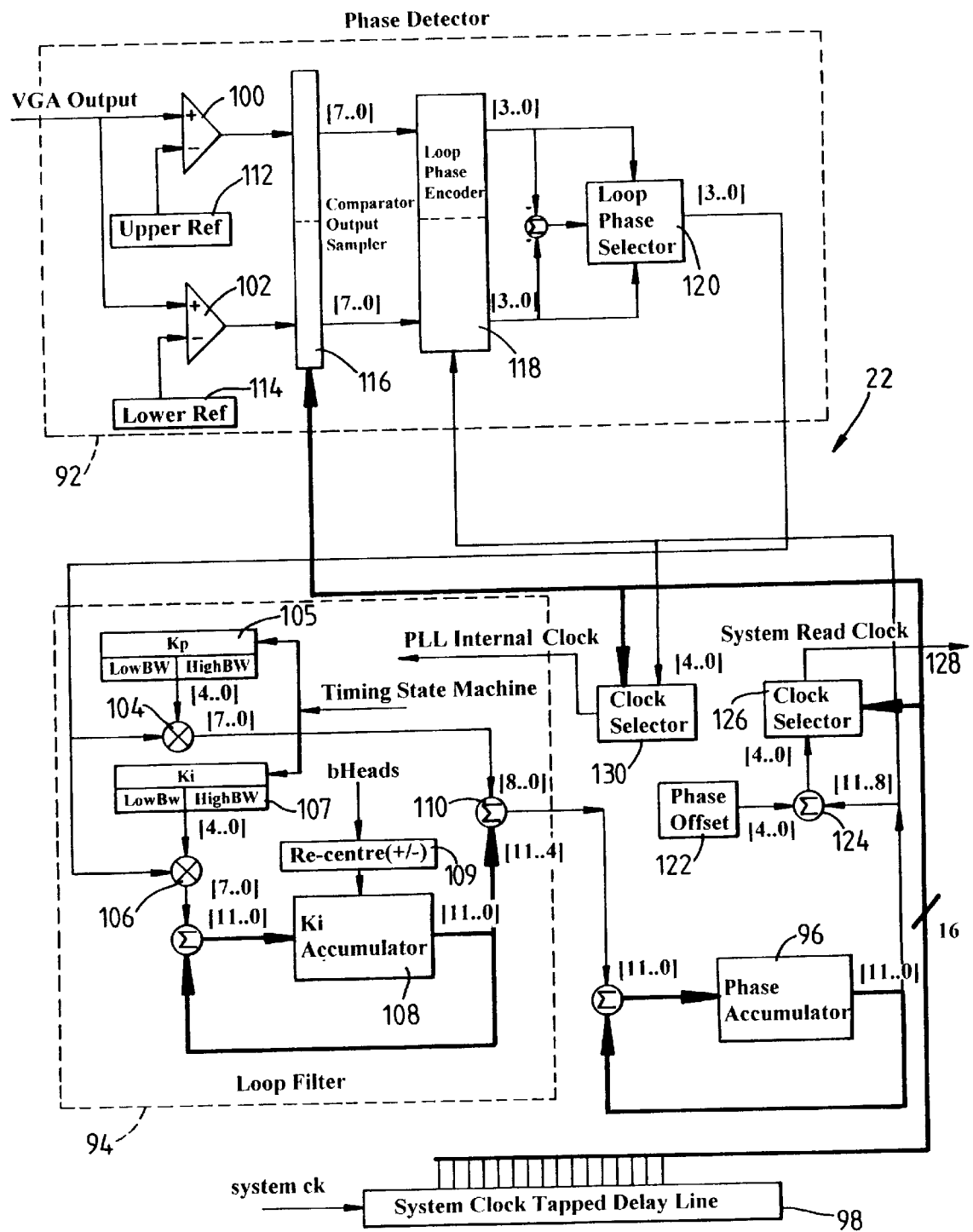
FIG. 4 is a block diagram of a phase lock loop for extracting a clock signal from the input data for use in the apparatus of FIG. 1.

Referring now to FIG. 4, the phase lock loop 22 is required to recover the bit clock from the read-back wave form under a variety of different conditions. Essentially, the phase lock loop 22 must acquire frequency and phase lock at the start of a track and then follow the bit frequency variations caused by head-tape velocity jitter, with a tolerable phase error.

In broad outline, the phase lock loop 22 comprises a phase detector 92, a loop filter 94, and a phase accumulator 96 whose output is used to select the appropriate clock signal from a series thereof available from a system clock tapped delay line 98.

The input signal has been subjected to automatic gain control at AGC 20,so that the nominal levels should be at 2, 0, −2 units. Two input comparators 100, 102, look for times when the input signal crosses a +/−1 unit (approximate) threshold. The times of these threshold crossings are then compared to the current clock time (system read clock) to determine the phase error. The phase error is digitally encoded (i.e. −4, −3, −2, −1, 1, 2, 3, 4 depending on the sign and magnitude of the phase error) and passed to the loop filter 94.

At the loop filter 94, the (digital) phase error is filtered using two multipliers 104, 106 and an accumulator 108. In the upper filtering path, the phase error is multiplied by a constant, Kp. In the lower filtering path, the phase error is multiplied by a constant Ki and the result is accumulated by the Ki accumulator 108. The accumulated (Ki) result and the direct (Kp) result are added together at a summer 110 and passed to the phase accumulator 96.

The phase accumulator 96 integrates the output of the loop filter 94. The upper four bits of the phase accumulator output act as a "pointer" to which of the sixteen delayed versions of the external system clock available at the delay line 98 will be used as the system read clock (i.e. the clock locked to the input signal).

Thus, as the input signal gets out of phase with the system read clock, the phase errors build up to a large value at the output to the loop filter 94, which causes the phase accumulator 96 to increment, eventually changing the upper four bits of its output, which then selects a delayed version of the system clock which is nearer in phase to the input signal.

Referring in more detail to the arrangement, to provide for the optimisation of error rate in the final product, the loop filter parameters are programmable; a second order loop is assumed. In addition, the loop bandwidth is switchable in real time, between two pre-programmed values. This is to make best use of the preamble zones, for acquisition, and still maintain low phase jitter in the data region. The phase lock loop 22 must be able to recover phase lock after signal drop outs that occur during normal replay of a track.

The recovered read clock drives the FFE 24, the ADC 26 and the Viterbi decoder 28, and so must be robust. It is preferred for the phase lock loop 22 to be able to operate in DDS-1/2 or DD-3 formats. DDS-1 or 2 format results in a two-level signal, where the bit sampling time is at the eye centre. Here, the phase detector 92 typically tests for zero crossings, as this method is simple and relatively insensitive to amplitude variations.

In DDS-3 format, reading of the format results in a three-level PR-1 signal. In this case, the phase detector 92 cannot test for simple zero crossings without disqualifying a large proportion of the incoming signal. a threshold crossing scheme is required (approximately +1, −1).

Thus, the PLL 22 contains a threshold-crossing-time phase detector 92, whose output is quantised into discrete steps. In DDS-1 or 2 mode, the phase detector responds to zeros crossings, whereas in DDS-3 mode it responds to half nominal signal levels crossings.

FIG. 4 shows two (conceptual) paths through the phase detector 92, where the input signal (from the AGC 20) is compared at 100, 102 to each of the half nominal signal level threshold levels (positive and negative). The timings of the threshold crossings in the incoming signal are compared at comparator output sampler 116 with eight evenly spaced (⅛th period shifted) phases of the output clock (derived from the 16 tap delay line 98) and at the loop phase encoder 118 to the current output phase selection. The quantised phase is then determined directly by loop phase selector 120 from between which of the eight output clock phases the input crossing falls.

In DDS-1 or 2 mode the input signal is compared to a single nominal zero level reference, and only the upper (conceptual) signal path in FIG. 4 is used. In DDS-3 mode, the half nominal signal thresholds are derived from phase detector threshold reference registers 112, 114, which programme DAC references to the AGC random data target DAC references. This arrangement allows the AGC targets, and PLL phase detector references to be independently optimised.

The quantised phase output from the loop phase selector 120 is then fed to a digital loop filter 94, having a Kp (proportional) and Ki (integral) term. For illustration, the phase detector 92 output is shown as a four bit bus (encoding the state {−4,−3,−2,−1,0,1,2,3,4}) and the multiplier 104, 106 outputs as an eight bit bus. The Kp and Ki multipliers may typically have the following ranges:
Kp range=0 . . . 31
Ki range=0 . . . 31
Multiplier output=−124 . . . 124

The Ki multiplier 106 feeds the Ki accumulator 108 which in this example has a range:
accumulator bits=12
Ki accumulator range=−2048 . . . 2047

The Ki accumulator 108 integrates the incoming Ki multiplier outputs, but only the most significant eight bits from the accumulator are added in adder 110 to the eight bits from the Kp multiplier 104, and then fed to the (least significant) end of the phase accumulator 96.

Thus the loop filter 94 can apply −252 . . . 252 to the phase accumulator 96 per bit period. The two programmable pairs of Kp and Ki values are available in registers 105, 107, to give the loop a fast or slow time constant, which can be selected by a state machine, in accordance with system requirements.

The Ki accumulator 108 is arranged to be reprogrammable when the conditions indicate that it has lost or is in danger of losing phase lock. For example, in the preamble region PLL frequency may be initialised. During so called "stunt modes" a frequency offset will occur where, for fast forward tape motion, the centre frequency of the A tracks may be displaced lower and the B tracks higher, (or vice versa for reverse tape motion). In addition, the Ki accumulator 108 may overflow either positively or negatively, indicating that the centre frequency is outside an acceptable range. Still further the Ki accumulator 108 may be re-centered if the FFE coefficients "Kickstart" routine as referred to above has been triggered. This condition indicates that there is a tape drop out or other disturbance to the signal which suggest that the PLL is likely to lose its phase lock.

Under these conditions, the most significant bits of the Ki accumulator 108 are loaded with the contents of a variable phase oscillator frequency offset register 109, which essentially re-centres the frequency to a default value. For example, the frequency may be re-centered to that with which the PLL 22 started reading the current track.

The digital phase accumulator 96 sums the output of the loop filter 94 and uses the four most significant bits to select an output clock phase from the sixteen tap delay line 98, which itself is phase locked to the system bit frequency clock. The 16 system clock phases from this delay line 98 are also used by the comparator output sampler 116 in the phase detector 92 to perform the timing of threshold crossings. The number of bits passed from the loop filter accumulator 108 to the phase accumulator 96 determines the maximum sustained frequency error that can be supported. The phase accumulator 96 integrates the loop filter 94 output (the sum of the Kp and Ki terms). The most significant four bits are used to select the phase of the system clock from the tapped delay line to be used as the current clock phase.

The phase accumulator output 96 is represented in this example as a twelve bit number, which can be regarded as a simple unsigned up-down counter. Thus as positive loop filter outputs are applied, the accumulator counts up until it reaches 4095 and then wraps around to zero. Likewise if negative loop filter outputs are applied it counts down until it reaches zero and then wraps around to 4095. Under these conditions, the four most significant bits simply increment from 0 . . . 15 and then wrap around to zero again, to that progressively later phases of the system clock are selected as the output clock. are adjusted so that the output of the sixteenth tap is coincident with the next system clock period (where the system clock frequency is different for the various operating modes of the channel).

A static phase offset value from a register 122 is incorporated at the summer 124 which provides an output to the clock selector 126 which selects the appropriate clock signal from the tapped delay line 98. There are two contributors to the need for a static phase offset between the phase at which the loop locks, and the clock phase which is applied at the output 128, which is used by the FFE 24 and the ADC 26. Firstly the FFE 24 samples at the bit centres, whereas the PLL 22 locks to the bit edges, where the transitions are. Secondly there are unknown circuit path delays between the phase measuring loop and the point at which the clock is used in the FFE. Accordingly the phase offset register is programmed with a four bit (unsigned) number which is added to the four most significant bits of the phase accumulator to select the clock phase to be passed to the FFE 24, and ADC 26 and the rest of the system, but not the clock phase of the PLL internal clock, which is selected by the clock selector 130.

Although the embodiments of FIGS. 1 to 4 have been described with reference to a sampled analogue scheme, we have also implemented this design in digital form and the invention extends to such digital implementations.

Attention is directed to our co-pending Applications No 96306940.6 (our reference 395007), 96306938.0 (our reference 394090) and 96306939.8 (our reference 394004/396026)) filed on even date herewith the contents of which are incorporated herein by reference.

What is claimed is:

1. An automatic gain control circuit for automatic gain control of an input signal having a first signal region followed by a second signal region, which circuit comprises:
   a variable gain amplifier connected for receiving and amplifying said input signal;
   a signal source arrangement for deriving first and second signals respectively representing target values controlling the gains the variable amplifier applies to the first and second signal regions,
   a gain control loop connected to be responsive to the output of said amplifier and to the respective target values the signal source arrangement derives for said first and second signal regions for controlling the gains said amplifier applies to said input signal, and
   a target controller connected to be responsive to an indication the gain control loop derives of the gains the variable gain amplifier applies to each of said first and second signal regions for adjusting at least one of said target values the signal source arrangement derives.

2. An automatic gain control circuit according to claim 1, wherein the target controller is arranged to cause one of said target values to remain constant and the other thereof to be adjusted in accordance with said monitored gain.

3. An automatic gain control circuit according to claim 1 further including a signal source for deriving the input signal and a further input signal also having a first region and a second region, said gain control loop being connected to be responsive to a respective target value for at least one of said first and second signal regions of said further input signal.

4. An automatic gain control circuit according to claim 1, wherein said gain control loop has relatively fast response time compared to that of said target controller.

5. An automatic gain control circuit according to claim 1 further including a source for adjusting the response time or the bandwidth of the gain control loop between preset values.

6. An automatic gain control circuit according to claim 1, wherein said first signal region comprises a preamble or margin region, and said second region comprises a random data region.

7. An automatic gain control circuit according to claim 1, wherein said gain control loop comprises a peak detector for detecting peaks in the output from said amplifier means and a comparator connected to be responsive to the detected peaks as derived by the peak detector and target values for the first and second signal regions.

8. The circuit of claim 1 further including a source of the input signal, the input signal source including a magnetic tape and a transducer arrangement for reading magnetic field variations of the tape, the tape being arranged for storing digital signals in a series of tracks each including a preamble region and a data region, the transducer arrangement being arranged to respond to the preamble region to derive a plain sinusoidal tone and to the data region to derive variable amplitude levels, the preamble and data regions respectively being the first and second regions of the input signal.

9. The circuit of claim 8 wherein the target controller is arranged so that the gain the amplifier applies to the input signal is substantially the same for the preamble and data regions.

10. The circuit of claim 1 wherein the gain controller includes a circuit element with a variable bandwidth, a controller for the bandwidth for causing the bandwidth to be high at the start of the first signal region, followed by a medium bandwidth, and then a low bandwidth shortly before the second region.

11. An automatic gain control circuit for automatic gain control of an input signal which includes a first and a second signal region, said circuit comprising:

a gain control loop comprising a variable gain amplifier, a signal source arrangement for deriving first and second target values respectively representing target values controlling the gains the variable gain amplifier applies to the first and second signal regions, a gain controller for adjusting (a) the gains said variable gain amplifier applies to the input signal in accordance with the output of said amplifier and (b) at least one of the target values the signal source arrangement derives for reducing the difference between the gains the amplifier applies to said first and second signal regions.

12. An automatic gain control circuit method of providing substantially continuous gain of a signal having a first signal region followed by a second signal region of different characteristics, which method comprises amplifying the amplitude of the signal in a variable gain amplifier responsive to a gain control signal of a gain control loop responsive to the signal the amplifier derives, deriving first and second signals respectively representing target values for controlling the gains the variable amplifier applies to the first and second signal regions, determining values indicative of the amplitudes of said gain control signal while said first signal region and said second signal region are being amplified, adjusting the value of at least one of the signals representing target values in accordance with said determined values, and controlling the amplitudes of the gain control signal for the first and second regions in response to the first and second signals, respectively.

13. An automatic gain control circuit for automatic gain control of an input signal including a first signal region and a second signal region, the first and second regions occurring at different times, said circuit comprising:

a variable gain amplifier connected to be responsive to the input signal;

a signal source arrangement for deriving first and second signals respectively representing target values for controlling the gains the variable gain amplifier applies to the first and second signal regions, a gain controller for adjusting the gains said variable gain amplifier applies to the input signal in accordance with the output of said variable gain amplifier and the respective target values the signal source arrangement derives for said first signal region and said second signal region, and a target controller connected to be responsive to an indication the gain controller derives of the gains the variable gain amplifier applies to said first and second signal regions for controlling the signal source arrangement to adjust at least one of said target values in accordance with the indication of the gains for thereby reducing the difference in the gains the amplifier applies to said first and second signal regions.

14. The automatic gain control circuit of claim 13, wherein the signal source arrangement includes a storage device for holding the target amplitude value for one of the signal regions, the target controller being arranged for controlling the storage device to cause the held target value to be (a) incremented in response to the gain difference between said first and second signal regions increasing, and (b) decremented in response to the gain difference between said first and second signal regions decreasing.

15. The automatic gain control circuit of claim 14 wherein the storage device includes a saturating counter.

16. The automatic gain control circuit of claim 13, wherein said first target controller is arranged to cause one of said target values to remain constant and the other target value to be adjusted in accordance with the gain indication.

17. The automatic gain control circuit of claim 13, wherein the response time of said gain control loop is relatively fast compared to the response time of said target control means.

18. The automatic gain control circuit of claim 13 wherein the gain controller has a variable bandwidth, and further including a source for adjusting the bandwidth of the gain controller between preset values.

19. The automatic gain controller of claim 13 wherein said first signal region is a preamble or margin region, and said second signal region is a random data region.

20. The circuit of claim 10 further including a source of the input signal, the input signal source including a magnetic tape and a transducer arrangement for reading magnetic field variations of the tape, the tape being arranged for storing digital signals in a series of tracks each including a preamble region and a data region, the transducer arrangement being attained to respond to the preamble region to derive a plain sinusoidal tone and to the data region to derive variable amplitude levels, the preamble and data regions respectively being the first and second regions of the input signal.

21. The circuit of claim 20 wherein the target controller is arranged so that the gain the amplifier applies to the input six is substantially the same for the preamble and data regions.

22. The circuit of claim 20 wherein the gain controller includes a circuit element with a variable bandwidth, a controller for the bandwidth for causing the bandwidth to be high at the start of the first signal region, followed by a medium bandwidth, and then a low bandwidth shortly before the second region.

23. The circuit of claim 20 wherein the tape includes a first series of tracks having a first azimuth and a second series of tracks having a second azimuth, the first and second series of tracks being interleaved so they are successively read by the transducer arrangement, the target controller including a separate target for each of the tracks.

24. The circuit of claim 23 wherein the first and second series of tracks are in a DDS-3 format.

25. The circuit of claim 20 further including a feed forward equalizer and a Viterbi decoder connected to be responsive to the output signal.

26. A method of providing substantially continuous gain control of a signal including a first signal region followed by a second signal region, the first and second regions having different characteristics, the method including steps of:

adjusting the gain applied to the signal by a variable gain amplifier in a gain control loop, deriving first and second signals respectively representing target values controlling the gains the variable amplifier applies to the first and second signal regions, the gains being adjusted in accordance with (a) the amplified output of the amplifier when it amplifies the signal and (b) the first and second signals respectively representing target values for said first signal region and said second signal region, deriving an indication of the gains the amplifier applies to each of said first and second signal regions, and adjusting the value of at least one of said first and second signals in accordance with the indication of the gains to reduce the difference in the gains the amplifier applies to the first and second signal regions.

27. The method of claim 26, wherein the step of deriving the indication of the gains includes:

storing the target value for one of the signal regions, incrementing the stored target value when the difference in gain between said first and second signal regions increases, and decrementing the stored target value when the difference in gain between said first and second signal regions decreases.

28. The method of claim 26 wherein the difference in gain the amplifier applies to the first and second regions is reduced substantially to zero.

29. A method of automatically and substantially continuously controlling the amplitude of a signal having a first region followed by a second region, the first and second regions of the signal having differing characteristics, the method comprising:

(a) amplifying the signal with a variable gain amplifier;

(b) deriving first and second signals respectively representing target values controlling the gains the variable amplifier applies to the first and second signal regions, (c) controlling the amount of amplification applied to the signal in step (a) by
   (i) responding to the amplitudes of the first and second regions of the amplified signal and the first and second signals respectively representing the target values for the amplitudes of the first and second regions of the amplified signal, and
   (ii) controlling the amplitude of the signal representing at least one of the target values to reduce differences between the amount of amplification applied during step (a) to the first and second regions of the amplified signal; step (c)(ii) being performed by responding to an indication of the amount of amplification applied to the signal during step (a).

30. The method of claim 29 wherein step (c)(i) is performed by comparing an indication of the amplitudes of the amplified signal derived for the first and second regions during step (a) with the first and second signals respectively representing the target values for the first and second regions.

31. The method of claim 29 wherein step (b)(i) is performed with a faster response time than step (b)(ii).

32. A method of amplifying a signal derived by a transducer arrangement that reads magnetic field variations of a tape storing digital signals in a series of tracks each including a preamble region and a data region, the transducer arrangement responding to the preamble region to derive a plain sinusoidal tone and to the data region to derive variable amplitude levels, the method comprising amplifying the signal with a variable gain amplifier having a gain controller with a controlled bandwidth, causing the bandwidth to be (a) high at the start of the preamble region, (b) followed by a medium value, and (c) then low shortly before the data region.

* * * * *